(12) United States Patent
Pfefferl et al.

(10) Patent No.: US 6,654,271 B2
(45) Date of Patent: Nov. 25, 2003

(54) METHOD FOR READING AND STORING BINARY MEMORY CELLS SIGNALS AND CIRCUIT ARRANGEMENT

(75) Inventors: Karl-Peter Pfefferl, Hohenkirchen (DE); Athanasia Chrysostomides, Munich (DE); Dominique Savignac, Ismaning (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/152,950

(22) Filed: May 21, 2002

(65) Prior Publication Data

US 2003/0007392 A1 Jan. 9, 2003

(30) Foreign Application Priority Data

May 21, 2001 (DE) .......................................... 101 24 752

(51) Int. Cl.[7] .............................. G11C 5/02; G11C 5/06
(52) U.S. Cl. ............................ 365/63; 365/51; 365/190
(58) Field of Search .............................. 365/51, 63, 69, 365/206, 190

(56) References Cited

U.S. PATENT DOCUMENTS

| | | | |
|---|---|---|---|
| 5,287,322 A | * | 2/1994 | Rastegar ...................... 365/190 |
| 5,696,727 A | | 12/1997 | Tsukude et al. ............. 365/208 |
| 5,808,930 A | * | 9/1998 | Wada et al. .................. 365/63 |
| 6,140,704 A | * | 10/2000 | Kang et al. .................. 257/773 |

* cited by examiner

*Primary Examiner*—Son Mai
(74) *Attorney, Agent, or Firm*—Fish & Richardson P.C.

(57) ABSTRACT

The invention features a method for reading and storing a binary memory cell signal where a signal transit time of the binary memory cell signal between one memory cell and an output terminal is reduced. The method includes applying a binary memory cell signal to a bit line pair; switching through the binary memory cell signal from the bit line pair to a local data line pair via a sense amplifier; switching through the amplified binary memory cell signal by a main data switching unit from the local data line to a main data line pair; and outputting the amplified, transferred binary memory cell signal via the first main data line and the second main data line pairs.

30 Claims, 2 Drawing Sheets

METHOD FOR READING AND STORING BINARY MEMORY CELLS SIGNALS AND CIRCUIT ARRANGEMENT

This application claims priority from German application no. 10124752.4, filed with the German Patent Office, Germany, on May 21, 2001, pursuant to 35 U.S.C. 119(a)–(d).

FIELD OF THE INVENTION

The invention features a method for reading out and storing binary memory cell signals and circuit arrangement. In particular, the present invention relates to binary memory cell arrays, and in particular relates to a method and a circuit arrangement for reading out binary memory cell signals from a memory cell array and for storing binary memory cell signals in a memory cell array, in which a signal transit time of the binary memory cell signals is minimized.

BACKGROUND OF THE INVENTION

In digital memories (RAM, DRAM, SRAM), an information item stored digitally in the form of binary memory cell signals has to be transferred to an output terminal of the circuit arrangement (chip). Memory cells are conventionally arranged in memory cell arrays having a size of 512×128 for example. In this case, 512 word lines can be activated in order to load a binary information item into the respective memory cell array. In the circuit arrangement specified above, 128 bit line pairs serve for reading out the corresponding binary information or for transferring the binary memory cell signals from the memory cell array and for storing binary memory cell signals in the memory cell array.

A bit line pair usually comprises two lines having complementary binary signal states. On account of the usually highly complex circuit arrangement, the bit line pairs cannot be used for forwarding binary memory cell signals directly to externally accessible output terminals. Besides a complex line structure, the binary memory cell signals additionally have to be regenerated or amplified in sense amplifiers or latches. In this case, it is necessary to arrange the sense amplifiers together with various switching transistor pairs in order that an information item present on bit line pairs is finally conducted away to an output terminal.

FIG. 1 shows a known circuit arrangement for reading out binary memory cell signals from memory cell arrays and for storing binary memory cell signals in memory cell arrays, individual memory cell arrays SZF and power supply lines being arranged in different planes.

Such memory cell arrays (for forming SRAMs, DRAMs) are described for example in WO 00/57422 A1 and DE 19917079.7, filed on Apr. 15, 1999.

Usually, a plurality of memory cell arrays are combined to form a unit. The binary memory cell signals are transferred to bit line pairs BL by the activation of word lines WL. The binary memory cell signals are transferred to sense amplifiers S/A, where the generally very low signal levels, which may be, for example, 100 mV or less, are brought to a defined logic level.

By means of a column control signal, the amplified binary memory cell signals are transferred by means of a local data line switching unit to a local data line pair formed from a local data line LDQ and a complementary local data line bLDQ. A central element of the conventional circuit arrangement shown in FIG. 1 is provided in the form of a main data line switching unit MDQS. The binary intermediate signals provided on the local data lines are transferred, in a manner dependent on a row control signal fed via a row control line, to the main data line pair formed by a main data line MDQ and a complementary main data line bMDQ.

The main data line pair MDQ, bMDQ is designed in such a way that the amplified, transferred binary memory cell signals can be transferred to external terminal units (not shown).

One disadvantage of such conventional circuit arrangements for reading out binary memory cell signals from at least one memory cell array or for storing binary memory cell signals in at least one memory cell array is that large coupling capacitances occur between the main data line MDQ and the complementary main data line bMDQ and also between the main data lines and other adjacent data lines or power lines. Such coupling capacitances are caused, inter alia, by a small distance between the main data line MDQ and the complementary main data line bMDQ governed by the conventional circuit design.

Furthermore, in a disadvantageous manner, these two lines lie at a predetermined distance, which is predetermined inter alia by a required interference suppression, next to one another and run over the entire chip area without taking account of the location at which data are transferred from memory cell arrays to the main data line pair.

In a further disadvantageous manner, chip area serving no specific function is taken up. However, occupation of sections of the chip area with unrequired main data line pairs has the result that required main data line pairs have to be arranged at an excessively small distance, whereby a coupling capacitance between the main data line MDQ and the complementary main data line bMDQ is increased further.

Such an increase in coupling capacitances leads in a disadvantageous manner to an increase in signal transit times for binary memory cell signals which are to be transferred from at least one memory cell array via bit line pairs BL, a sense amplifier S/A, a local data line pair LDQ, bLDQ, a main data line switching unit MDQS and a main data line pair MDQ, bMDQ to a terminal unit (not shown) for an external terminal.

On account of fluctuations in the specifications during memory fabrication, caused by the technological fabrication processes, these increases in a signal transit time have a disadvantageous effect on a data access time.

SUMMARY OF THE INVENTION

Consequently, it is an object of the present invention to provide a method and a circuit arrangement for reading out binary memory cell signals from at least one memory cell array or for storing binary memory cell signals in at least one memory cell array in which a signal transit time of the binary memory cell signals is minimized.

The heart of the invention is a circuit arrangement in which coupling capacitances are reduced by enlarging a distance between a main data line and a corresponding complementary main data line or another adjacent line, or reducing a length of a main data line pair.

The invention's method for reading out binary memory cell signals from at least one memory cell array and for storing binary memory cell signals in at least one memory cell array, in which a signal transit time of the binary memory cell signals between at least one memory cell and at least one output terminal is reduced, has the following steps:

a) application of at least one binary memory cell signal to at least one bit line pair in a manner dependent on an activation of a word line;

b) switching-through of the binary memory cell signal from the bit line pair to a local data line pair via at least one sense amplifier, in order to obtain defined logic levels on the local data line pair;

c) switching-through of the amplified binary memory cell signal by means of at least one main data line switching unit from the local data line pair to at least one main data line pair, which is formed by at least one main data line and at least one complementary main data line, binary memory cell signals being transferred from memory cells arranged in a first memory cell region to at least one first main data line pair and binary memory cell signals being transferred from memory cells arranged in a second memory cell region to at least one second main data line pair; and d) outputting of the amplified, transferred binary memory cell signals via the first main data line pair and the second main data line pair.

In accordance with one preferred development of the present invention, coupling capacitances between the second main data line and the second complementary main data line are reduced by enlargement of the distance between the second main data line and the second complementary main data line in the second memory cell region.

In accordance with a further preferred development of the present invention, coupling capacitances between the first main data line and the first complementary main data line are reduced by reduction of a line length of the first main data line and the first complementary main data line in the first memory cell region.

The invention's circuit arrangement for reading out binary memory cell signals or for storing binary memory cell signals in at least one memory cell array furthermore has:

a) at least one bit line pair for applying at least one binary memory cell signal in reaction to an activation of a word line;

b) at least one sense amplifier for switching through the binary memory cell signal from the bit line pair to a local data line pair; and c) at least one main data line switching unit for switching through the amplified binary memory cell signal from the local data line pair to at least one main data line pair, which is formed by at least one main data line and at least one complementary main data line, binary memory cell signals being transferred from memory cells arranged in a first memory cell region to at least one first main data line pair and binary memory cell signals being transferred from memory cells arranged in a second memory cell region to at least one second main data line pair.

BRIEF DESCRIPTION OF THE DRAWINGS

Exemplary embodiments of the invention are illustrated in the drawings and are explained in more detail in the description below.

In the drawings.

In the figures, identical reference symbols designate identical or functionally identical components. Below is a list of reference symbols used in the drawings.

Figure 1:
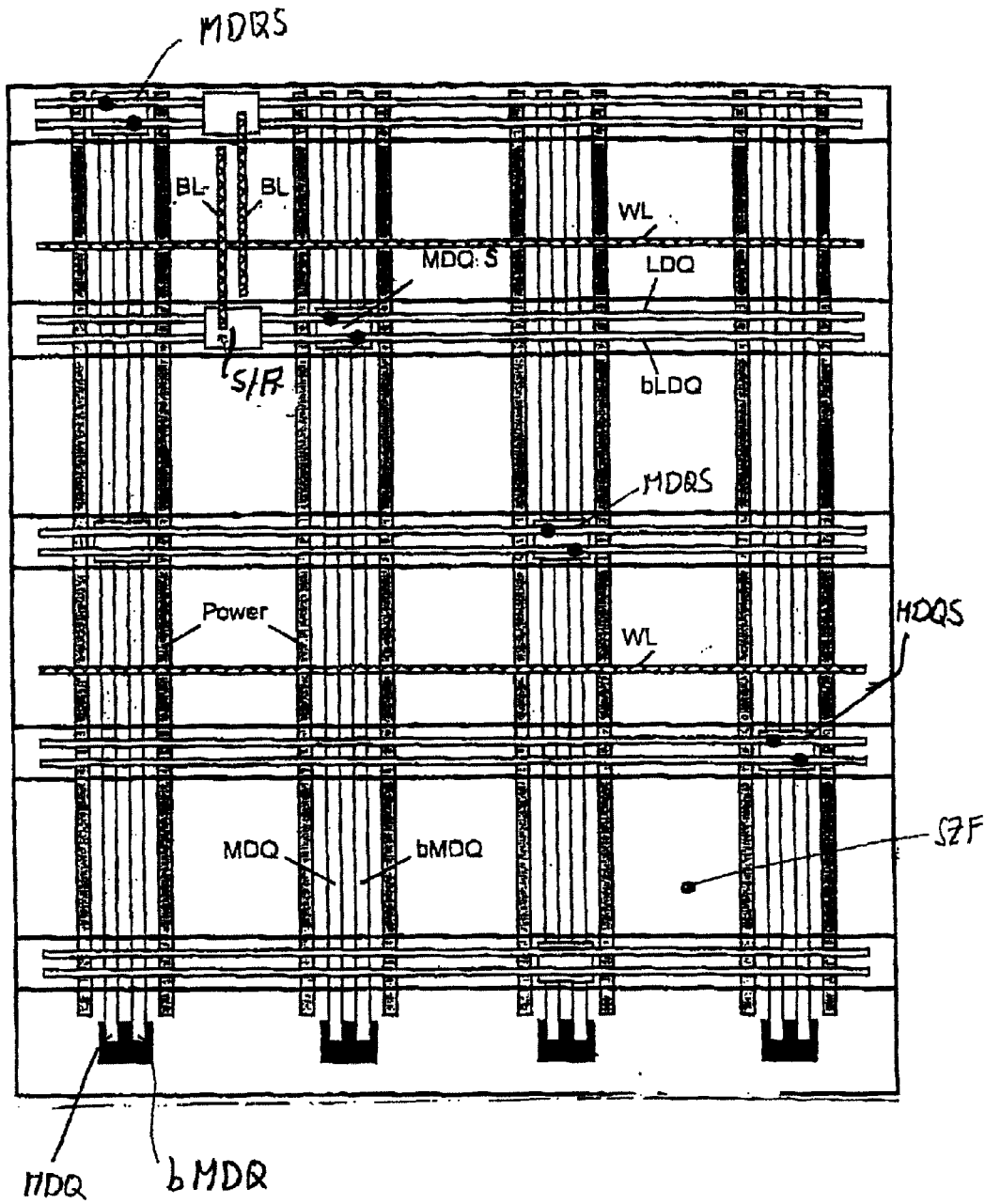
FIG. 1 shows a conventional circuit arrangement for reading out and for storing binary memory cell signals.

100 First memory cell region
101 First main data line
102 First complementary main data line
200 Second memory cell region
201 Second main data line
202 Second complementary main data line
301 Bit line pair
302 Power supply line
303 Sense amplifier
304 Main data line switching unit
305 Local data line pair
306 Word line

DETAILED DESCRIPTION

Figure 2:
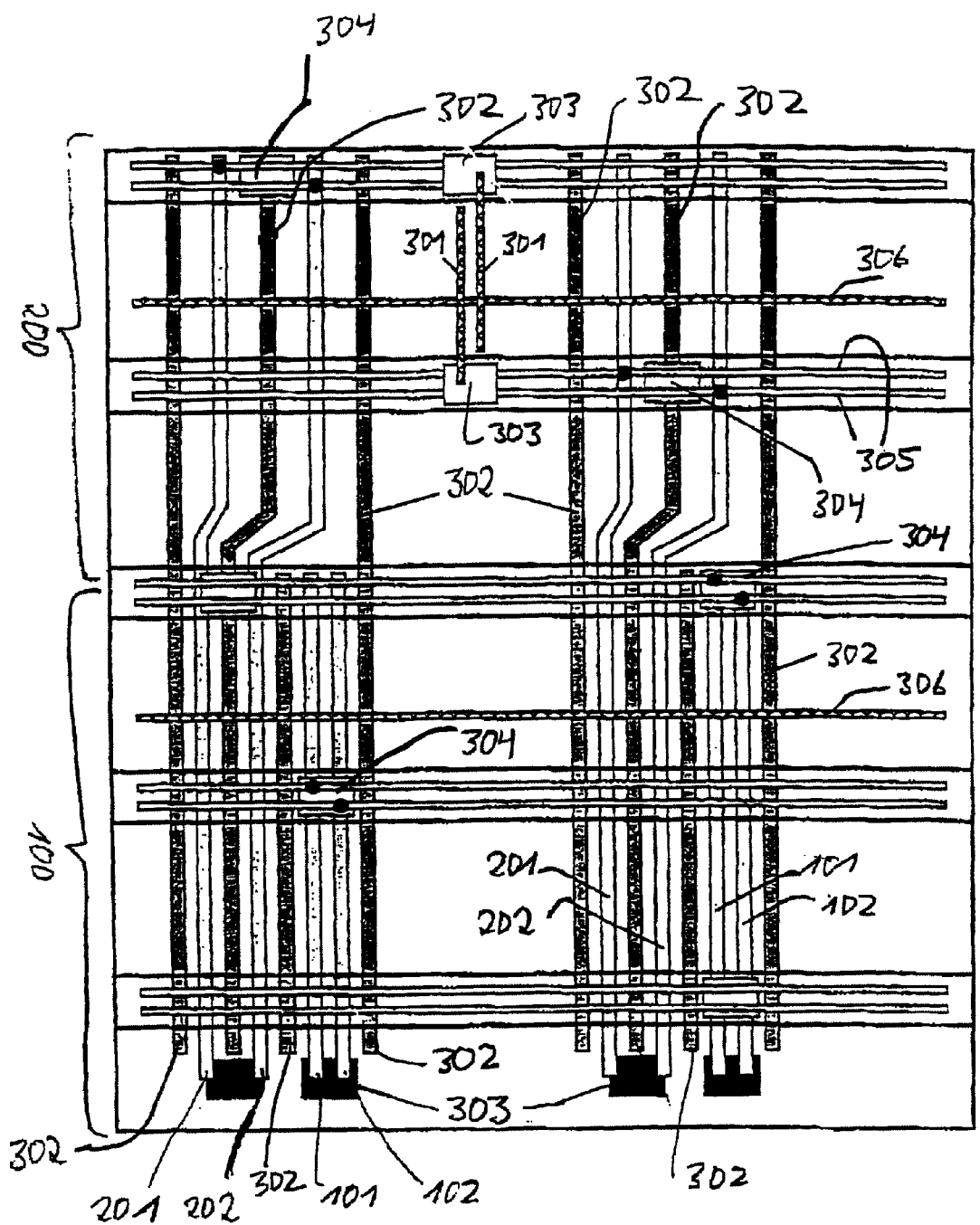
FIG. 2 shows an exemplary embodiment of the invention's circuit arrangement for reading out binary memory cell signals from or for storing binary memory cell signals in first and second memory cell arrays.

In the case of the exemplary embodiment of the circuit arrangement according to the invention as shown in FIG. 2, two memory cell regions are shown, a first memory cell region 100 and a second memory cell region 200, binary memory cell signals from both memory cell regions having to be read out from respective memory cell arrays or stored therein.

After an activation by an activation signal which is applied to a word line 306, at least one binary memory cell signal is applied to at least one bit line pair 301. Furthermore, the binary memory cell signal is switched through from the memory cell via the bit line pair 301 to at least one sense amplifier 303 by means of at least one memory cell array switching unit (not shown) in a manner dependent on at least one memory cell array control signal fed via at least one memory cell array control line (not shown).

After a conditioning of the binary memory cell signal in the sense amplifier 303, a binary output signal of the sense amplifier 303 is switched through to a local data line pair 305, which transfers the amplified binary memory cell signal to a main data line switching unit 304. The binary output signal of the sense amplifier 303 is switched to a main data line pair, which comprises a main data line and a complementary main data line, by means of the main data line switching unit 304 in a manner dependent on a row control signal fed via a row control line (not shown).

In accordance with the exemplary embodiment of the present invention shown, amplified, transferred binary memory cell signals which originate from memory cells from the first memory cell region 100 are transferred to an output terminal (not shown) via a first main data line pair, which is formed from a first main data line 101 and a first complementary main data line 102. On the other hand, binary memory cell signals which originate from memory cells in the second memory cell region 200 are transferred to the output terminal via a second main data line pair, which is formed from a second main data line 201 and a second complementary main data line 202.

As is illustrated in FIG. 2, the first main data line 101 and the first complementary main data line 102 of the first main data line pair run only in the first memory cell region, since only binary memory cell signals from the first memory cell region are applied to the first main data line pair. In the exemplary embodiment shown, this results in a reduction of a line length by 50%, which results approximately in a corresponding reduction of a coupling capacitance between the first main data line 101 and the first complementary main data line 102.

Consequently, this circuit arrangement according to the invention considerably reduces a signal transit time of binary memory cell signals which originate from memory cells in the first memory cell region.

The line lengths of the second main data line pair formed from the second main data line 201 and the second complementary main data line 202 cannot be reduced since binary memory cell signals have to be transferred from the second memory cell region 200 to the output terminal (not shown). However, as a result of restricting a line length of the first main data line 101 and of the first complementary main data line 102 to the first memory cell region 100, the possibility is afforded, as shown in FIG. 2, of enlarging the distance between the second main data line 201 and the second complementary main data line 202 in the second memory cell region.

In the exemplary embodiment of the present invention shown, the distance between the second main data line 201 and the second complementary main data line 202 in the second memory cell region 200 is approximately doubled, which, in this region, corresponds approximately to a halving of the coupling capacitances between the second main data line 201 and the second complementary main data line 202. Furthermore, it can be seen that a power supply line 302, which is generally provided for supplying power to components of the circuit unit, is arranged between the second main data line 201 and the second complementary main data line 202.

The power supply line 302 further contributes to reducing a capacitive coupling or coupling capacitances between the second main data line 201 and the second complementary main data line 202. A signal transit time of binary memory cell signals which originate from memory cells both from the first memory cell region 100 and from the second memory cell region 200 is considerably reduced in this way.

Furthermore, in order to further reduce coupling capacitances, it is possible to provide a power supply line 302 between the first main data line 101 and the second main data line 102.

With regard to the conventional circuit arrangement illustrated in FIG. 1, reference is made to the introduction to the description.

Although the present invention has been described above using the preferred exemplary embodiments, it is not restricted thereto, but rather can be modified in diverse ways.

What is claimed is:

1. A method for reading and storing a binary memory cell signal, the method comprising:
    applying a binary memory cell signal to a bit line pair;
    switching through the binary memory cell signal from the bit line pair to a local data line pair via a sense amplifier, thereby generating an amplified binary memory cell signal;
    switching through the amplified binary memory cell signal by a main data line switching unit from the local data line pair to a main data line pair formed by a first main data line and a first complementary main data line,
    wherein the amplified binary memory cell signal is transferred from memory cells arranged in a first and second memory cell region to a first and second main data line pair, respectively, thereby generating a transferred binary memory signal;
    reducing coupling capacitances between the second main data line and a second complementary main data line by increasing a distance between the second main data line and the second complementary main data line in the second memory cell region; and
    outputting the transferred binary memory cell signal via the first main data line pair and the second main data line pair.

2. The method of claim 1, further comprising reducing coupling capacitances between the second main data line and an adjacent line by increasing a distance between the second main data line and the adjacent line in the second memory cell region.

3. The method of claim 1, further comprising reducing capacitances between the first main data line and the first complementary main data line by reducing a line length of the first main data line and the first complementary main data line in the first memory cell region.

4. The method of claim 1, further comprising providing a power supply line between the second main data line and the second complementary main data line to reduce coupling capacitances between the first main data line and the first complementary main data line.

5. The method of claim 1, further comprising providing a power supply line between the second main data line and the second complementary main data line to reduce coupling capacitances between the second main data line and the second complementary main data line.

6. A circuit arrangement comprising:
    a bit line pair for applying a binary memory cell signal;
    a sense amplifier for switching through the binary memory cell signal from the bit line pair to a local data line pair; and
    a main data line switching unit for switching through the amplified binary memory cell signal from the local data line pair to a main data line pair formed by a first main data line and a first complementary main data line,
    wherein the binary memory cell signal is transferred from memory cells arranged in a first and second memory cell region to a first and second main data line pair, respectively.

7. The circuit arrangement of claim 6, further comprising a power supply line between a second main data line and a second complementary main data line to reduce coupling capacitances between the first main data line and the first complementary main data line.

8. The circuit arrangement of claim 6, wherein a distance between a second main data line and a second complementary main data line in the second memory cell region is increased to reduce coupling capacitances between the second main data line and the second complementary main data line.

9. The circuit arrangement of claim 6, wherein a distance between a second main data line and an adjacent line in the second memory cell region is increased to reduce coupling capacitances between the second main data line and the adjacent line.

10. The circuit arrangement of claim 6, wherein a line length of the first main data line and the first complementary main data line in the first memory cell region is reduced to reduce capacitances between the first main data line and the first complementary main data line.

11. A method for reading and storing a binary memory cell signal, the method comprising:
    applying a binary memory cell signal to a bit line pair;
    switching through the binary memory cell signal from the bit line pair to a local data line pair via a sense amplifier, thereby generating an amplified binary memory cell signal;
    switching through the amplified binary memory cell signal by a main data line switching unit from the local data line pair to a main data line pair formed by a first main data line and a first complementary main data line, wherein the amplified binary memory cell signal is transferred from memory cells arranged in a first and second memory cell region to a first and second main data line pair, respectively, thereby generating a transferred binary memory signal; and reducing coupling capacitances between the second main data line and an adjacent line by increasing a distance between the second main data line and the adjacent line in the second memory cell region; and outputting the transferred binary memory cell signal via the first main data line pair and the second main data line pair.

12. The method of claim 11, further comprising reducing coupling capacitances between the second main data line and a second complementary main data line by increasing a distance between the second main data line and the second complementary main data line in the second memory cell region.

13. The method of claim 11, further comprising reducing capacitances between the first main data line and the first complementary main data line by reducing a line length of the first main data line and the first complementary main data line in the first memory cell region.

14. The method of claim 11, further comprising providing a power supply line between the second main data line and a second complementary main data line to reduce coupling capacitances between the first main data line and the first complementary main data line.

15. The method of claim 11, further comprising providing a power supply line between the second main data line and a second complementary main data line to reduce coupling capacitances between the second main data line and the second complementary main data line.

16. A method for reading and storing a binary memory cell signal, the method comprising:

applying a binary memory cell signal to a bit line pair;

switching through the binary memory cell signal from the bit line pair to a local data line pair via a sense amplifier, thereby generating an amplified binary memory cell signal;

switching through the amplified binary memory cell signal by a main data line switching unit from the local data line pair to a main data line pair formed by a first main data line and a first complementary main data line, wherein the amplified binary memory cell signal is transferred from memory cells arranged in a first and second memory cell region to a first and second main data line pair, respectively, thereby generating a transferred binary memory signal;

reducing capacitances between the first main data line and the first complementary main data line by reducing a line length of the first main data line and the first complementary main data line in the first memory cell region; and outputting the transferred binary memory cell signal via the first main data line pair and the second main data line pair.

17. The method of claim 16, further comprising reducing coupling capacitances between the second main data line and a second complementary main data line by increasing a distance between the second main data line and the second complementary main data line in the second memory cell region.

18. The method of claim 16, further comprising reducing coupling capacitances between the second main data line and an adjacent line by increasing a distance between the second main data line and the adjacent line in the second memory cell region.

19. The method of claim 16, further comprising providing a power supply line between the second main data line and a second complementary main data line to reduce coupling capacitances between the first main data line and the first complementary main data line.

20. The method of claim 16, further comprising providing a power supply line between the second main data line and a second complementary main data line to reduce coupling capacitances between the second main data line and the second complementary main data line.

21. A method for reading and storing a binary memory cell signal, the method comprising:

applying a binary memory cell signal to a bit line pair;

switching through the binary memory cell signal from the bit line pair to a local data line pair via a sense amplifier, thereby generating an amplified binary memory cell signal;

switching through the amplified binary memory cell signal by a main data line switching unit from the local data line pair to a main data line pair formed by a first main data line and a first complementary main data line, wherein the amplified binary memory cell signal is transferred from memory cells arranged in a first and second memory cell region to a first and second main data line pair, respectively, thereby generating a transferred binary memory signal;

providing a power supply line between the second main data line and a second complementary main data line to reduce coupling capacitances between the second main data line and the second complementary main data line; and outputting the transferred binary memory cell signal via the first main data line pair and the second main data line pair.

22. The method of claim 21, further comprising reducing coupling capacitances between the second main data line and a second complementary main data line by increasing a distance between the second main data line and the second complementary main data line in the second memory cell region.

23. The method of claim 21, further comprising reducing coupling capacitances between the second main data line and an adjacent line by increasing a distance between the second main data line and the adjacent line in the second memory cell region.

24. The method of claim 21, further comprising reducing capacitances between the first main data line and the first complementary main data line by reducing a line length of the first main data line and the first complementary main data line in the first memory cell region.

25. The method of claim 21, further comprising providing a power supply line between the second main data line and a second complementary main data line to reduce coupling capacitances between the first main data line and the first complementary main data line.

26. A circuit arrangement comprising:

a bit line pair for applying a binary memory cell signal;

a sense amplifier for switching through the binary memory cell signal from the bit line pair to a local data line pair; and a main data line switching unit for switching through the amplified binary memory cell signal from the local data line pair to a main data line pair formed by a first main data line and a first complementary main data line, wherein the binary memory cell signal is transferred from memory cells arranged in a first and second memory cell region to a first and second main data line pair, respectively; and wherein a distance between a second main data line and a second complementary main data line in the second memory cell region is increased to reduce coupling capacitances between the second main data line and the second complementary main data line.

27. The circuit arrangement of claim 26, further comprising a power supply line between a second main data line and a second complementary main data line to reduce coupling capacitances between the first main data line and the first complementary main data line.

28. The circuit arrangement of claim 26, further comprising a power supply line between a second main data line and a second complementary main data line to reduce coupling capacitances between the second main data line and the second complementary main data line.

29. The circuit arrangement of claim 26, wherein a distance between a second main data line and an adjacent line in the second memory cell region is increased to reduce coupling capacitances between the second main data line and the adjacent line.

30. The circuit arrangement of claim 26, wherein a line length of the first main data line and the first complementary main data line in the first memory cell region is reduced to reduce capacitances between the first main data line and the first complementary main data line.

* * * * *